(12) United States Patent
Lin et al.

(10) Patent No.: US 11,800,669 B2
(45) Date of Patent: Oct. 24, 2023

(54) CONNECTING STRUCTURE AND ELECTRONIC DEVICE HAVING THE SAME

(71) Applicant: Chiun Mai Communication Systems, Inc., New Taipei (TW)

(72) Inventors: Chia-Ju Lin, New Taipei (TW); Fu-Hsin Sung, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 17/585,879

(22) Filed: Jan. 27, 2022

(65) Prior Publication Data

US 2022/0256721 A1 Aug. 11, 2022

Related U.S. Application Data

(60) Provisional application No. 63/146,222, filed on Feb. 5, 2021.

(51) Int. Cl.
| | |
|---|---|
| *H05K 5/00* | (2006.01) |
| *H05K 5/02* | (2006.01) |
| *E05D 3/12* | (2006.01) |
| *E05D 11/08* | (2006.01) |
| *E05D 11/00* | (2006.01) |

(52) U.S. Cl.
CPC ......... *H05K 5/0226* (2013.01); *H05K 5/0017* (2013.01); *E05D 3/122* (2013.01); *E05D 11/0054* (2013.01); *E05D 11/087* (2013.01); *E05Y 2201/702* (2013.01); *E05Y 2900/606* (2013.01)

(58) Field of Classification Search
None
See application file for complete search history.

(56) References Cited

U.S. PATENT DOCUMENTS

| | | | | |
|---|---|---|---|---|
| 9,464,471 | B1* | 10/2016 | Chen | G06F 1/1681 |
| 9,524,000 | B2* | 12/2016 | Hsu | G06F 1/1681 |
| 9,677,308 | B1* | 6/2017 | Chen | E05D 3/18 |
| 10,281,951 | B2* | 5/2019 | Vic | E05D 3/06 |
| 10,551,880 | B1* | 2/2020 | Ai | G06F 1/1641 |
| 11,099,611 | B2* | 8/2021 | Hallar | G06F 1/1618 |

(Continued)

FOREIGN PATENT DOCUMENTS

| | | |
|---|---|---|
| CN | 201629055 U | 11/2010 |
| CN | 103939457 A | 7/2014 |

(Continued)

*Primary Examiner* — Anthony Q Edwards
*Assistant Examiner* — Rashen E Morrison
(74) *Attorney, Agent, or Firm* — ScienBiziP, P.C.

(57) ABSTRACT

A non-protruding connecting structure allowing zero to 360 degrees and any intermediate angle of relative rotation between two display screens includes a hinge assembly, a first shaft body, a second shaft body, and a fixing member. The hinge assembly includes first and second wheels sleeved on first and second shaft bodies, and an enmeshed worm engaged with the first and second wheels. A central axis of the first wheel is parallel to that of the second wheel. The axis of the worm is perpendicular to that of the first and second wheels. A rotation direction of the first wheel is opposite to that of the second wheel. The fixing member fixes the hinge assembly. An electronic device including the connecting structure is also disclosed.

18 Claims, 16 Drawing Sheets

(56) References Cited

U.S. PATENT DOCUMENTS

| | | | |
|---|---|---|---|
| 2015/0047152 A1 | 2/2015 | Cheng | |
| 2015/0159413 A1* | 6/2015 | Chen | E05D 3/122 |
| | | | 16/342 |
| 2016/0060927 A1* | 3/2016 | Xu | H05K 5/0226 |
| | | | 361/679.55 |

FOREIGN PATENT DOCUMENTS

| | | |
|---|---|---|
| CN | 106963540 A | 7/2017 |
| TW | M539211 U | 4/2017 |

* cited by examiner

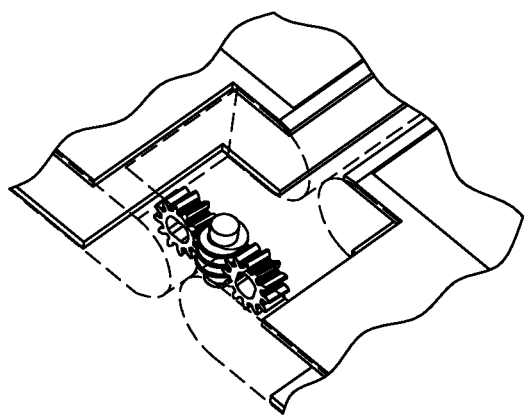 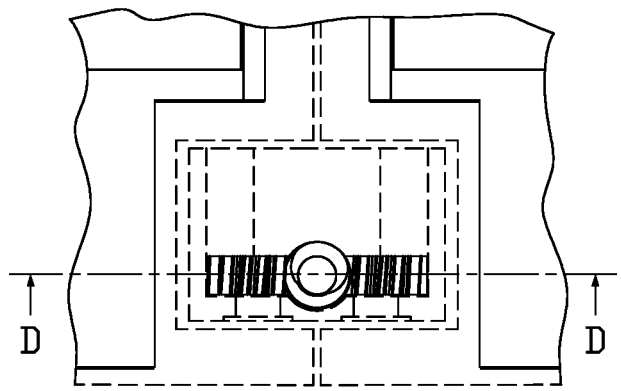
FIG. 15A  FIG. 15B
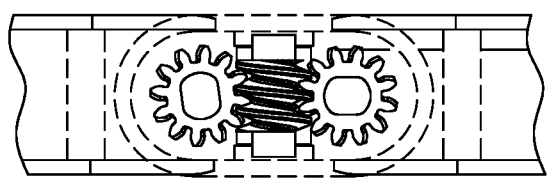 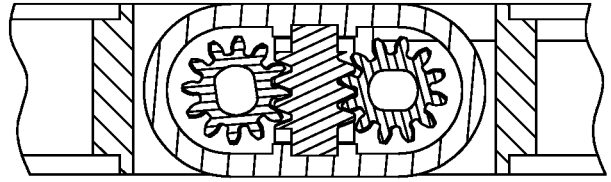
FIG. 15C  FIG. 15D

CONNECTING STRUCTURE AND ELECTRONIC DEVICE HAVING THE SAME

FIELD

The subject matter relates to linkages, and more particularly, to a connecting structure and an electronic device having the connecting structure.

BACKGROUND

Display screens of large size are becoming more and more popular. When the size of the display screen of an electronic device is increased, the total size of the electronic device is also increased, thus limiting its use in a miniaturized device. A dual screen device may provide a solution.

In a dual screen display system, the two screens are rotated relative to each other through a connecting structure. However, the connecting structure may protrude out of the screens when the two screens are disposed into one plane, which may affect an appearance of the device. Furthermore, the two screens cannot rotate 360 degrees about each other. Therefore, there is room for improvement in the art.

BRIEF DESCRIPTION OF THE DRAWINGS

Implementations of the present technology will now be described, by way of example only, with reference to the attached figures.

FIG. 15A is an enlarged diagrammatic view of the electronic device of FIG. 11D.

FIG. 15B is an enlarged perspective view of the electronic device of FIG. 11D.

FIG. 15C is a side view along a view line D-D in FIG. 15B.

FIG. 15D is a cross-sectional view taken along the view line D-D in FIG. 15B.

DETAILED DESCRIPTION

Figure 1:
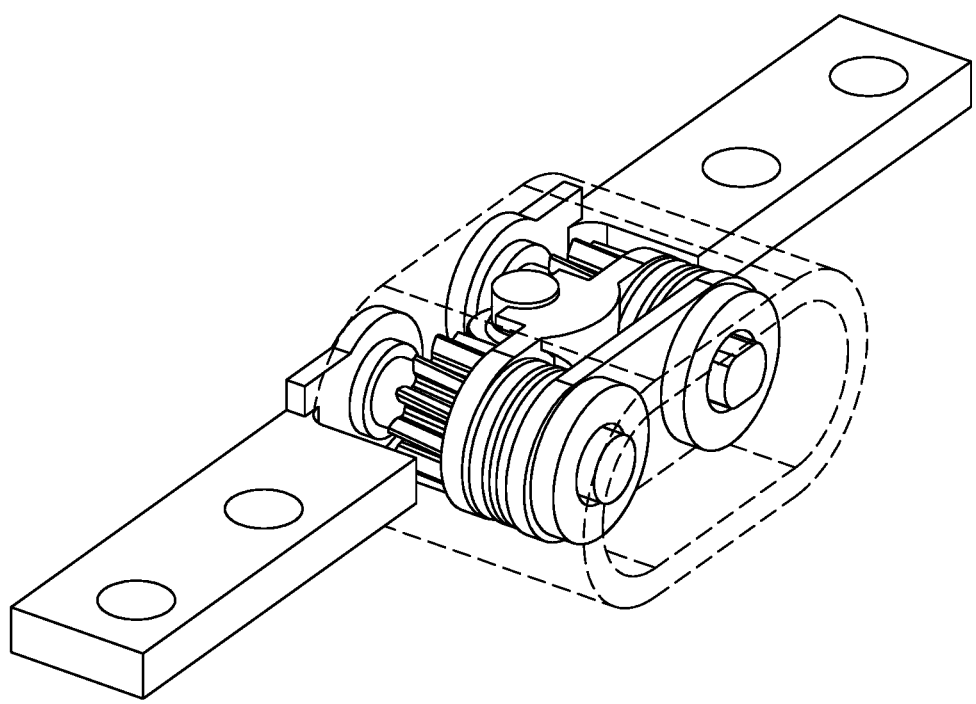
FIG. 1 is a diagrammatic view of a connecting structure according to an embodiment of the present disclosure.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIGS. 1 to 5 illustrate a non-protruding connecting structure 100 allowing zero to 360 degrees of relative rotation between two display screens, which includes a hinge assembly 1, a first shaft body 2, a second shaft body 3, and a fixing member 4. The hinge assembly 1 includes a first wheel 11, a second wheel 12, and a worm 13 disposed between and engaged with the first wheel 11 and the second wheel 12. A central axis (defined as "a") of the first wheel 11 is parallel to a central axis (defined as "b") of the second wheel 12. A central axis (defined as "c") of the worm 13 is perpendicular to each of the central axis "a" of the first wheel 11 and the central axis "b" of the second wheel 12. A rotation direction of the first wheel 11 is opposite to a rotation direction of the second wheel 12. The first shaft body 2 includes a first rotating shaft 21 extending through the first wheel 11. The second shaft body 3 includes a second rotating shaft 31 extending through the second wheel 12. The fixing member 4 is used to fix the hinge assembly 1.

Figure 2:
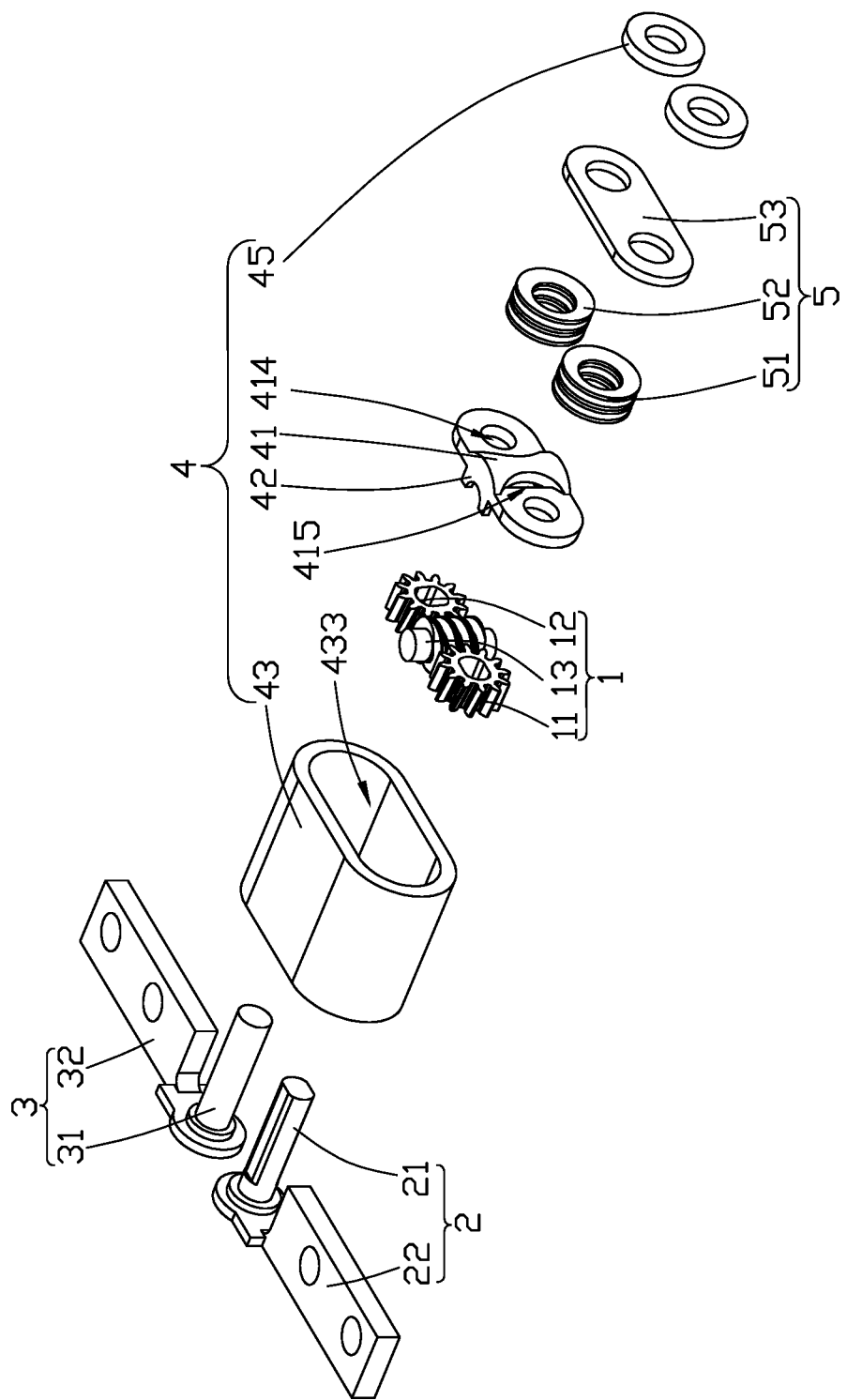
FIG. 2 is an exploded view of the connecting structure of FIG. 1.
Figure 3:
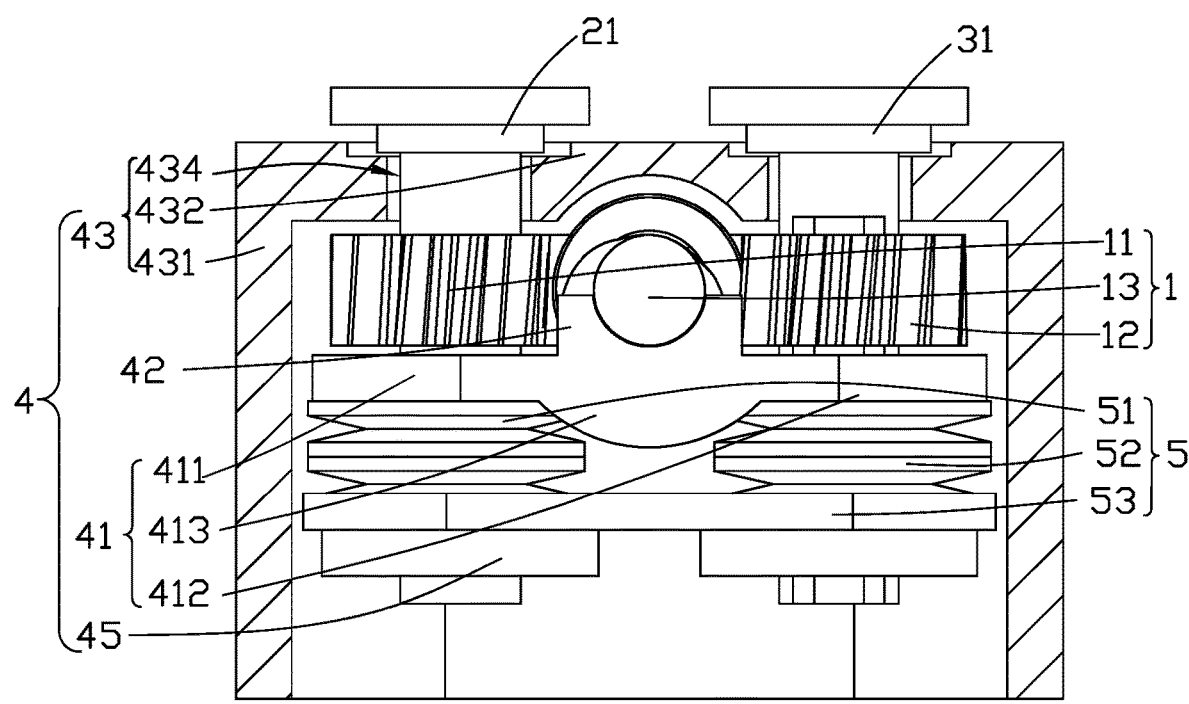
FIG. 3 is similar to FIG. 1, but showing the connecting structure in another state.

Referring to FIGS. 2 and 3, the fixing member 4 includes a supporting plate 41 and at least one first fixing portion 42 disposed on the supporting plate 41. Each of the first rotating shaft 21 and the second rotating shaft 31 extends through the supporting plate 41. At least one end of the worm 13 is rotationally fixed on the first fixing portion 42.

In an embodiment, the supporting plate 41 includes a first wing plate 411, a second wing plate 412, and a connecting plate 413. The connecting plate 413 is disposed between and connected to the first wing plate 411 and the second wing plate 412. The first fixing portion 42 is disposed on one side of the connecting plate 413 close to the hinge assembly 1. Each of the first wing plate 411 and the second wing plate 412 defines a through hole 414. The first rotating shaft 21 extends through the first wheel 11, and the second rotating shaft 31 extends through the second wheel 12. And then each of the first rotating shaft 21 and the second rotating shaft 31 extends through one through hole 414. The first wing plate 411 and the second wing plate 412 fix and limit the first wheel 11 and the second wheel 12, respectively. At this time, the worm 13 is fixed by the connecting plate 413. And at least one end of the worm 13 is limited by the first fixing portion 42, so that the worm 13 can rotate only within the first fixing portion 42.

In an embodiment, the connecting plate 413 is an arcuate plate protruding towards a side away from the worm 13.

In an embodiment, a first fixing portion 42 is disposed on each end of the connecting plate 413, so ends of the worm 13 are fixed in the first fixing portions 42, respectively. The two first fixing portions 42 limit the two ends of the worm 13, to ensure stable rotation of the worm 13. Rotation of the hinge assembly 1 is thus always stable and smooth.

Referring to FIGS. 2 and 3, the fixing member 4 also includes a fixing sleeve 43, which is used to cover an outside of the hinge assembly 1. The fixing sleeve 43 cooperates with the first fixing portion 42 to further limit the hinge assembly 1.

In an embodiment, the fixing sleeve 43 includes a hollow fixing body 431 and an end wall 432 disposed on one side of the fixing body 431 close to the first shaft body 2 and the second shaft body 3. A port 433 of the fixing body 431 faces the end wall 432. Two through holes 434 corresponding to the first rotating shaft 21 and the second rotating shaft 31 are defined on the end wall 432. The first wheel 11 and the second wheel 12 are received in a hollow cavity of the fixing body 431. Each of the first rotating shaft 21 and the second rotating shaft 31 extends through a through hole 434 on the end wall 432. The first rotating shaft 21 and the second rotating shaft 31 then extend through the first wheel 11 and the second wheel 12, respectively. Finally, each of the first rotating shaft 21 and the second rotating shaft 31 extends through a through hole 414 on the supporting plate 41. The supporting plate 41 and the fixing sleeve 43 cooperate to realize a stable fixing of the hinge assembly 1.

Figure 4:
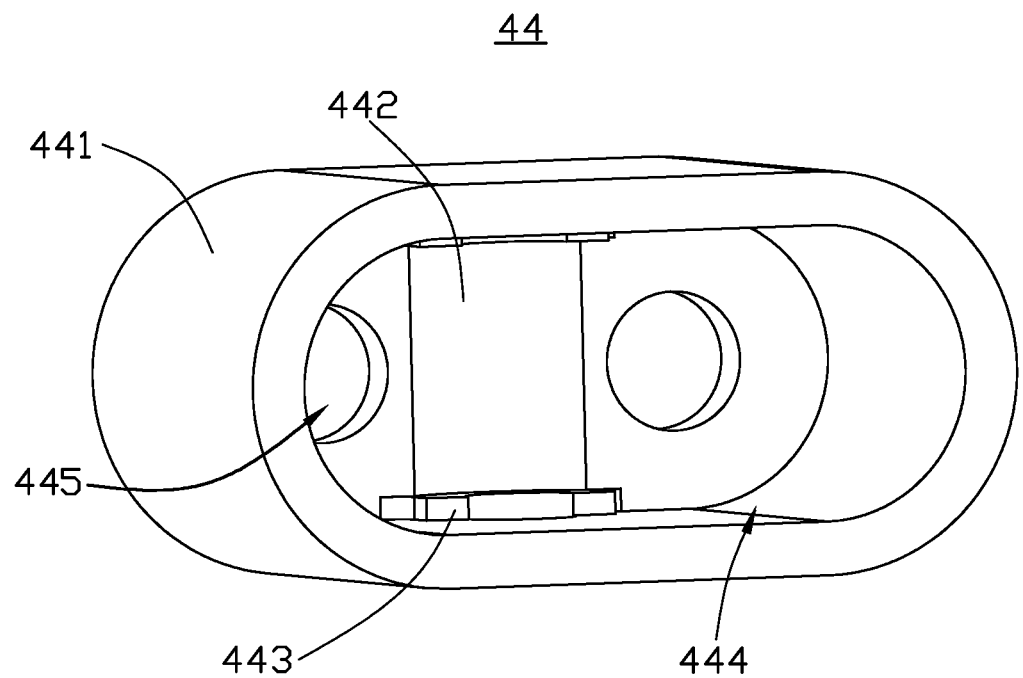
FIG. 4 is a diagrammatic view of another fixing sleeve of the connecting structure of FIG. 1.

Referring to FIGS. 2 and 4, in another embodiment, the fixing sleeve 44 includes a hollow fixing body 441, an end wall 442 disposed on one side of the fixing body 441 close to the first shaft body 2 and the second shaft body 3, and at least one second fixing portion 443 disposed on an inner wall of the end wall 442. The fixing body 441 is sleeved on an outside of the hinge assembly 1. At least one end of the worm 13 is rotatably disposed on the second fixing portion 443. A port 444 of the fixing body 441 faces the end wall 442. Two through holes 445 corresponding to the first rotating shaft 21 and the second rotating shaft 31 are defined on the end wall 442. The first wheel 11 and the second wheel 12 are received in a hollow cavity of the fixing body 441. Each of the first rotating shaft 21 and the second rotating shaft 31 extends through a through hole 445 on the end wall 442. The first rotating shaft 21 and the second rotating shaft 31 then extend through the first wheel 11 and the second wheel 12, respectively. Finally, each of the first rotating shaft 21 and the second rotating shaft 31 extends through a through hole 414 on the supporting plate 41. The supporting plate 41 and the fixing sleeve 44 cooperate to realize the stable fixing of the hinge assembly 1. The first fixing portion 42 and the second fixing portion 443 cooperatively define a shaft sleeve, which can sleeve at least one end of the worm 13, so as to further strengthen the stability of the worm 13 during rotation.

Referring to FIGS. 2 and 3, the connecting structure 100 also includes an elastic unit 5 disposed on a side of the supporting plate 41 away from the hinge assembly 1. The elastic unit 5 includes a first elastic member 51, a second elastic member 52, and an elastic supporting plate 53. The first rotating shaft 21 extends through the first elastic member 51 and then through the elastic supporting plate 53, and the second rotating shaft 31 extends through the second elastic member 52 and then through the elastic supporting plate 53. During the rotation of the hinge assembly 1, the first elastic member 51 bears axial loading of the first rotating shaft 21. The second elastic member 52 bears axial loading of the second rotating shaft 31. The first elastic member 51 and the second elastic member 52 can be deformed under loading. When deformed, a certain potential energy is stored in each of the first elastic member 51 and the second elastic member 52. When loading between the first rotating shaft 21 and the hinge assembly 1 is removed, the first elastic member 51 releases some of the potential energy to maintain the pressure between the first rotating shaft 21 and the hinge assembly 1, to achieve a tight connection, the same release by the second elastic member 52 can occur, for tightness of connection, when loading between the second rotating shaft 31 and the hinge assembly 1 is removed. Therefore, the elastic unit 5 can further ensure that the first shaft body 2 and the second shaft body 3 stop freely at any position during the rotation of the hinge assembly 1.

The first elastic member 51 and the second elastic member 52 are disc springs. A distribution of stress of the disc spring decreases evenly from inside to outside, which achieves low stroke and high compensation force. The disc spring allows reduction of the size and volume of the connecting structure 100.

Referring to FIGS. 2 and 3, two void avoidance grooves 415 corresponding to the first elastic member 51 and the second elastic member 52 are defined on a side of the connecting plate 413 away from the worm 13. With the two void avoidance grooves 415, the first elastic member 51 and the second elastic member 52 are closely sleeved on the first rotating shaft 21 and the second rotating shaft 31, respectively.

Referring to FIGS. 2 and 3 again, the fixing member 4 further includes two rotating shaft fixing portions 45. The first rotating shaft 21 extends through the first wheel 11, and the second rotating shaft 31 extends through the second wheel 12. Each of the first rotating shaft 21 and the second rotating shaft 31 is rotatably fixed on a rotating shaft fixing portion 45.

Referring to FIG. 2, the first shaft body 2 further includes a first connecting plate 22 connected to the first rotating shaft 21. The second shaft body 3 further includes a second connecting plate 32 connected to the second rotating shaft 31. The first connecting plate 22 and the second connecting plate 32 can be used to connect different parts which need to be connected.

In an embodiment, the first rotating shaft 21 is disposed perpendicular to the first connecting plate 22. The second rotating shaft 31 is disposed perpendicular to the second connecting plate 32.

Figure 5:
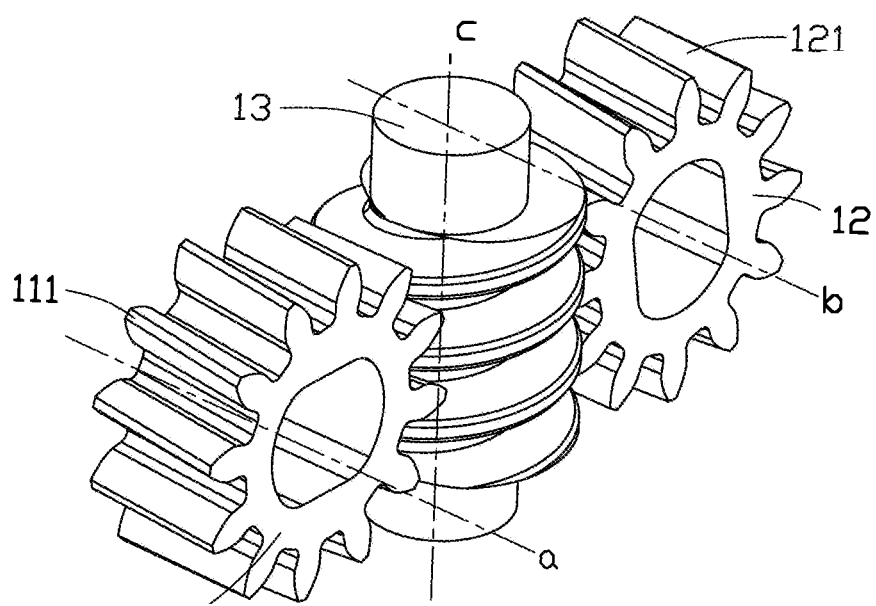
FIG. 5 is a diagrammatic view of a hinge assembly of the connecting structure of FIG. 1.

Referring to FIG. 5, the first wheel 11 includes a plurality of first teeth 111. The second wheel 12 includes a plurality of second teeth 121. Each first tooth 111 is inclined relative to the central axis "a" of the first wheel 11. Each second tooth 121 is inclined relative to the central axis "b" of the second wheel 12. The inclined teeth ensure fully enmeshed transmission between the first wheel 11, the second wheel 12, and the worm 13.

Figure 6:
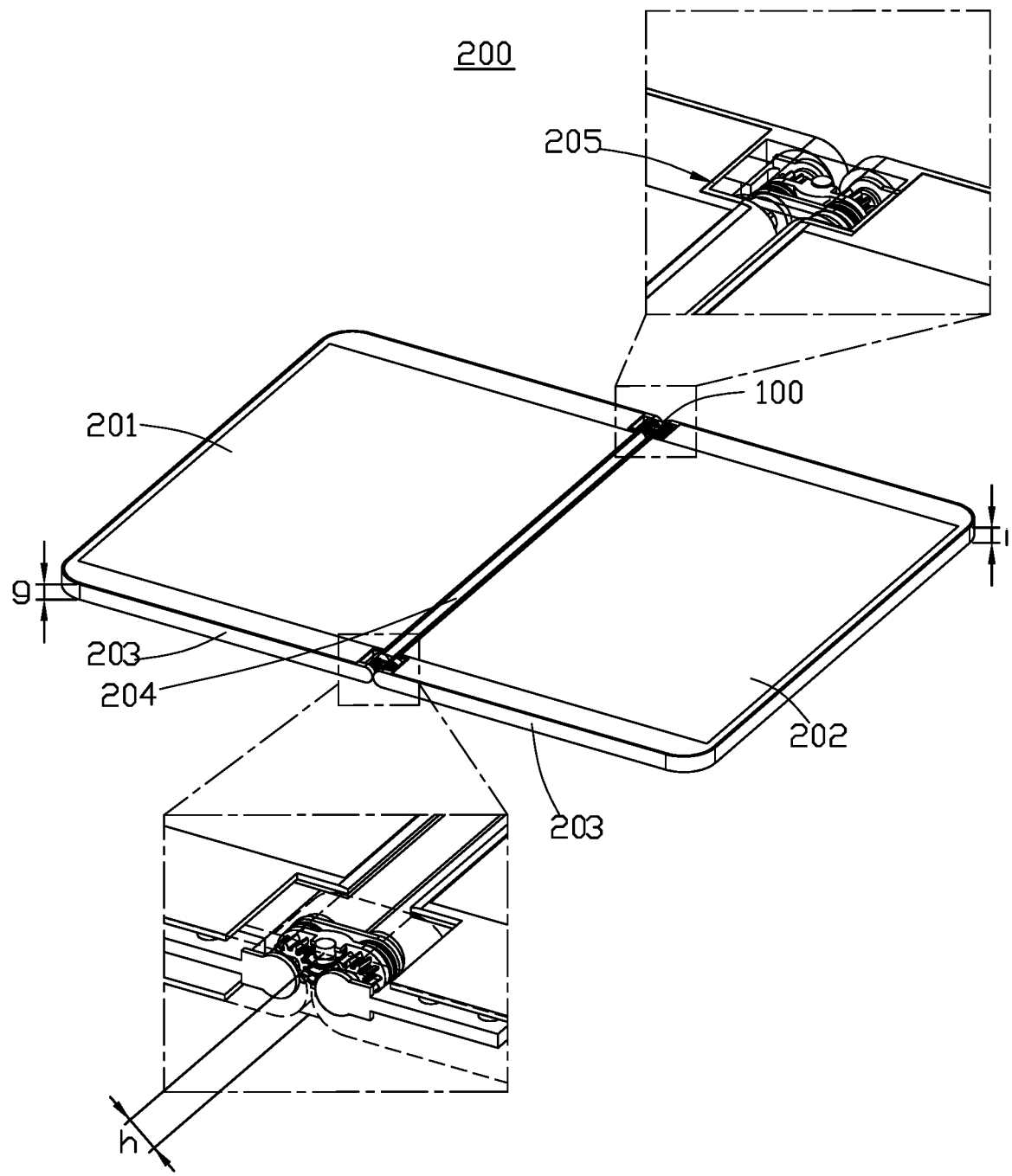
FIG. 6 is a diagrammatic view of an electronic device with the connecting structures of FIG. 1 wherein a first body is rotated 180 degrees relative to a second body.
Figure 7:
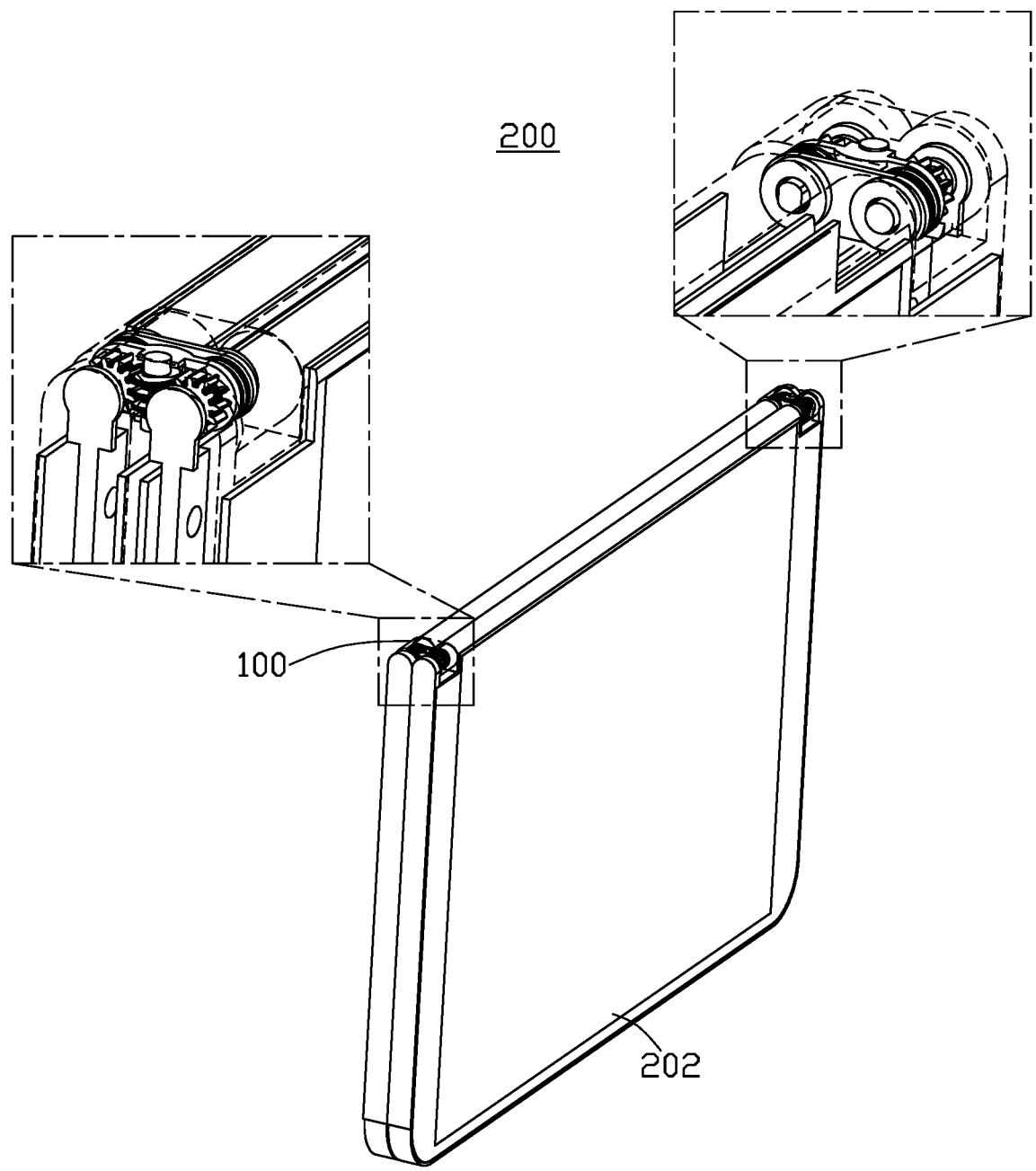
FIG. 7 is similar to FIG. 6, wherein the first body and the second body are rotated 360 degrees relative to each other.
Figure 8:
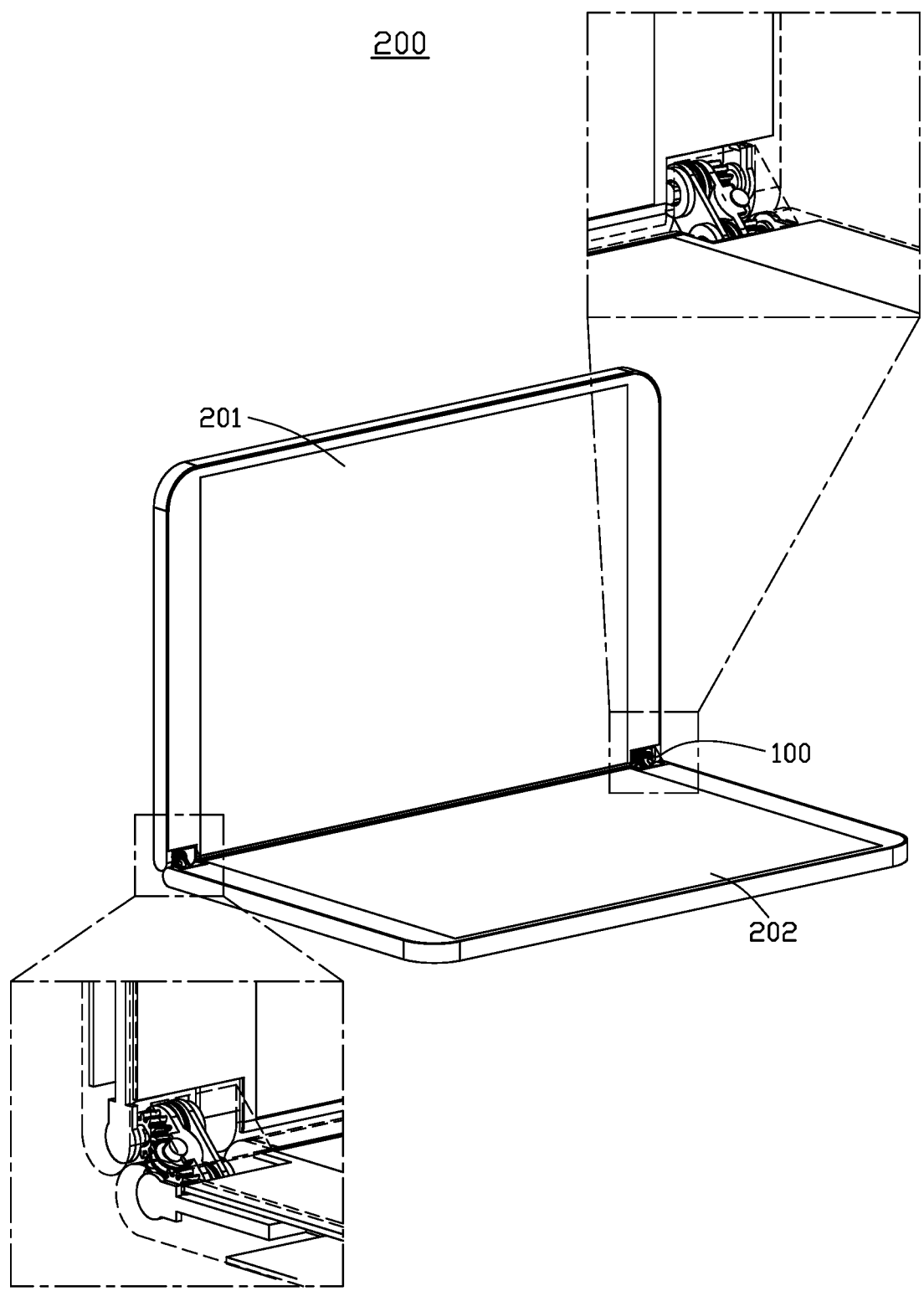
FIG. 8 is similar to FIG. 6, wherein the first body and the second body are rotated 90 degrees relative to each other.

FIGS. 6 to 8 illustrate an electronic device 200, which includes at least one connecting structure 100, a first body 201, and a second body 202. The first body 201 is connected to the first shaft body 2, and the second body 202 is connected to the second shaft body 3. The first body 201 and the second body 202 are rotatably connected to each other through the connecting structure 100. As shown in FIGS. 6 to 8, the first body 201 can be rotated to an angle relative to the second body 202. The angle between the first body 201 and the second body 202 is in a range of zero to 360 degrees. The connecting structure 100 does not protrude out from an outer surface of the first body 201 and an outer surface of the second body 202 during rotation, especially when the first body 201 is coplanar with the second body 202 (as shown in FIG. 6).

In an embodiment, the first body 201 is connected to the first connecting plate 22, and the second body 202 is connected to the second connecting plate 32.

In an embodiment, referring to FIG. 6 in combination with FIG. 3, along the central axis "c" of the worm 13, a thickness "h" of the connecting structure 100 is not more than the thickness "g" of the first body 201 or the thickness "l" of the second body 202.

In an embodiment, the thickness "h" of the connecting structure 100, the thickness "g" of the first body 201, and the thickness "l" of the second body 202 are equal.

In an embodiment, a coupling edge 204 is defined between the first body 201 and the second body 202. At least one coupling portion 205 is disposed on the coupling edge 204. One connecting structure 100 is disposed on the coupling portion 205.

Referring to FIGS. 6 and 3, in an embodiment, the electronic device 200 further includes two protective covers 203. One protective cover 203 covers an end of the first rotating shaft 21 away from the first connecting plate 22, and the other protective cover 203 covers an end of the second rotating shaft 31 away from the second connecting plate 32. The two protective covers 203 protect the connecting structure 100. Each protective cover 203 is further connected to a side wall of the first body 201 and a side wall of the second body 202, so there is visual integration of the connecting structure 100 with the first body 201 and the second body 202 for good aesthetics of the electronic device 200.

In an embodiment, two coupling portions 205 are disposed on ends of the coupling edge 204. A connecting structure 100 is disposed on each coupling portion 205. Referring to FIGS. 6 to 16D, angular rotation of the electronic device 200 is described in detail as below.

Referring to FIG. 6, the angle between the first body 201 and the second body 202 in the electronic device 200 is equal to 180 degrees. The connecting structures 100 on the coupling portions 205 are enlarged in FIG. 6. As shown in FIG. 6, the first body 201 is made planar with the second body 202, or the first body 201 is coplanar with the second body 202. The two connecting structures 100 do not protrude out from the coupling portions 205 and provide a certain tension to the first body 201 and the second body 202 during the rotation of the first body. That is, the two connecting structures 100 are flush or lower than an outer surface of the first body and an outer surface of the second body during rotation of the first body.

As shown in FIG. 7, the angle between the first body 201 and the second body 202 in the electronic device 200 is equal to 360 degrees. As shown in FIG. 8, the angle between the first body 201 and the second body 202 in the electronic device 200 is equal to 90 degrees. The connecting structures 100 on the coupling portions 205 are enlarged in FIGS. 7 and 8. Furthermore, the state of the electronic device 200 in FIG. 8 is similar to that shown in FIG. 7 when the angle between the first body 201 and the second body 202 is equal to zero degrees (defined as "closed state").

Figure 9:
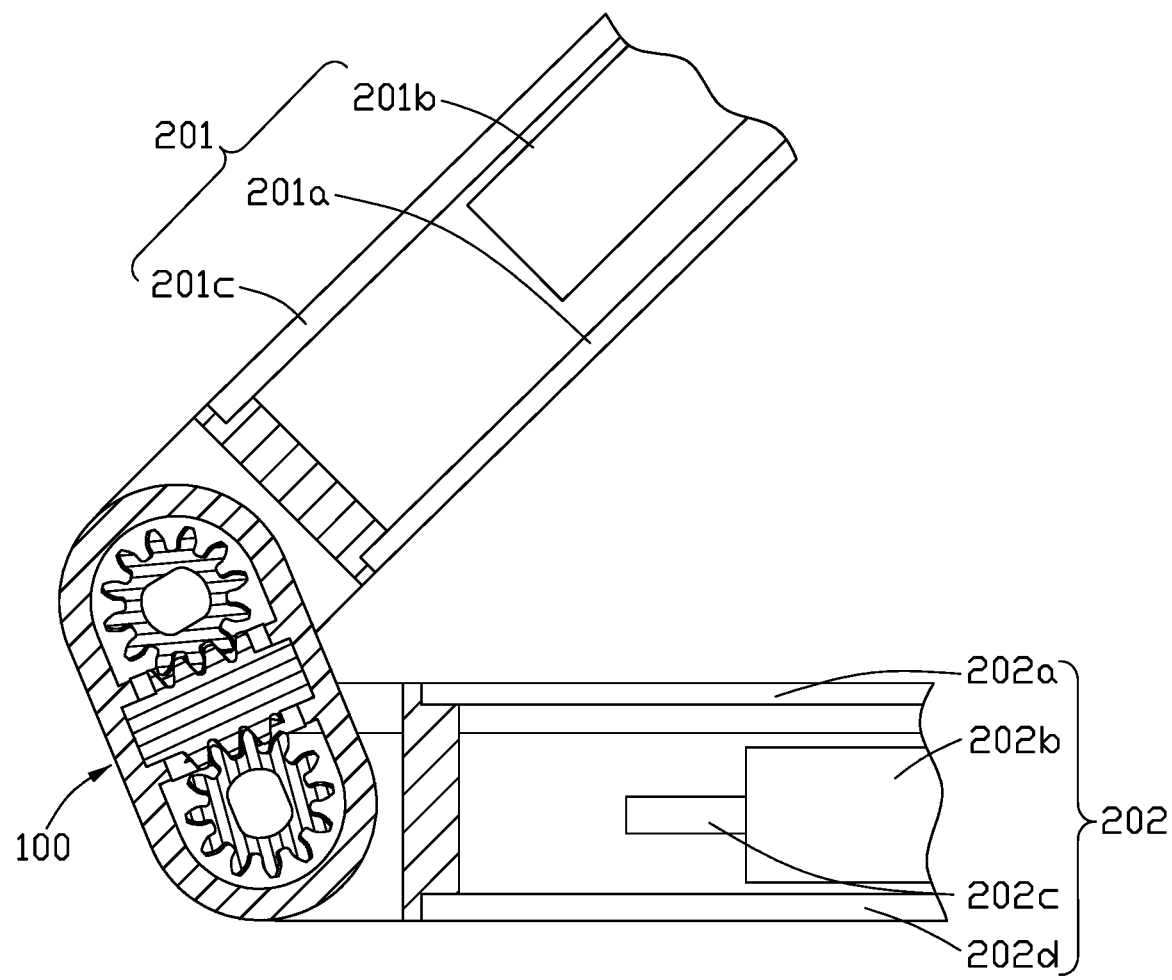
FIG. 9 is a sectional view of the electronic device of FIG. 6, wherein the first body and the second body are rotated 45 degrees.
Figure 10A:
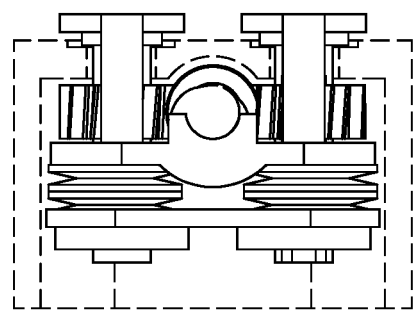
FIGS. 10A, 10B, 10C, 10D, and 10E are front views of the electronic device of FIG. 6, showing the first body rotated zero degrees, 45 degrees, 90 degrees, 180 degrees, and 360 degrees relative to the second body.
Figure 10B:
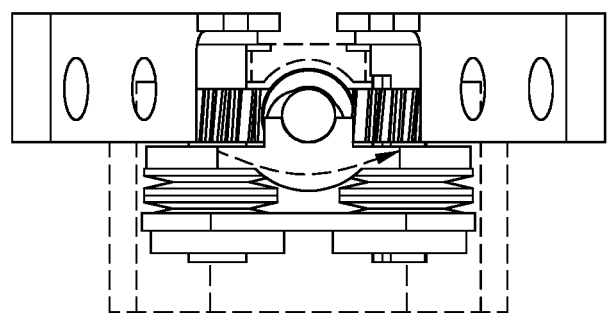
Figure 10C:
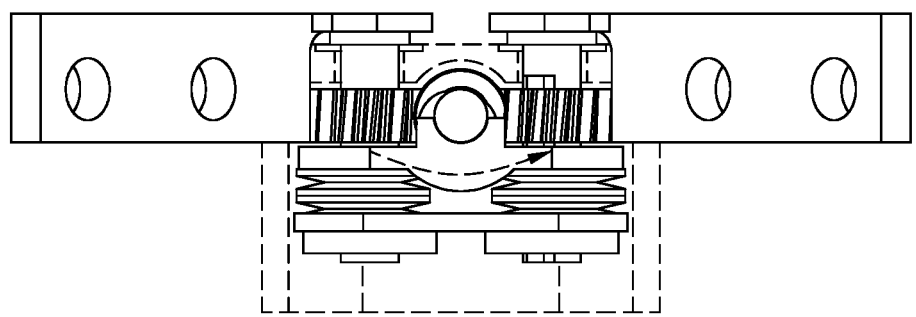
Figure 10D:
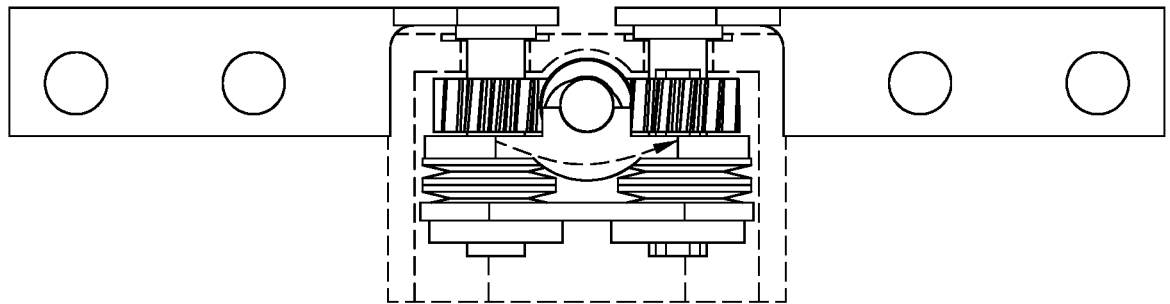
Figure 10E:
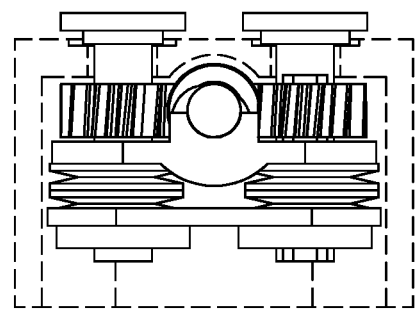
Figure 11A:
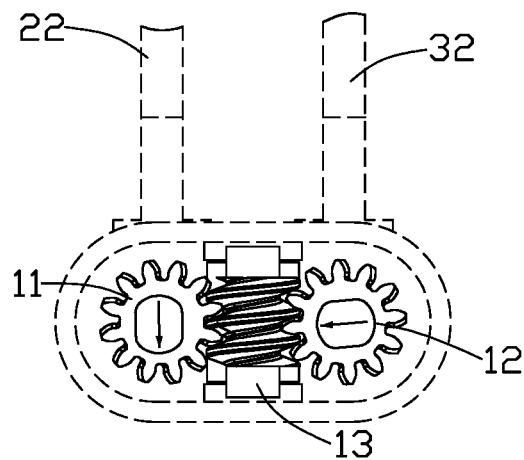
FIGS. 11A, 11B, 11C, 11D, and 11E are side views of the electronic device of FIG. 6 showing the first body rotated zero degrees, 45 degrees, 90 degrees, 180 degrees, and 360 degrees relative to the second body.
Figure 11B:
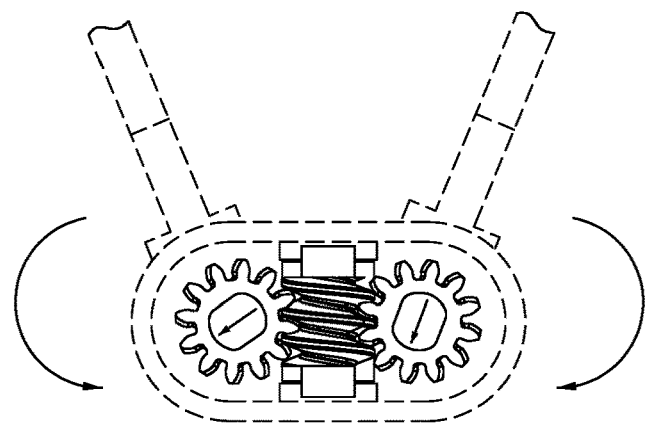
Figure 11C:
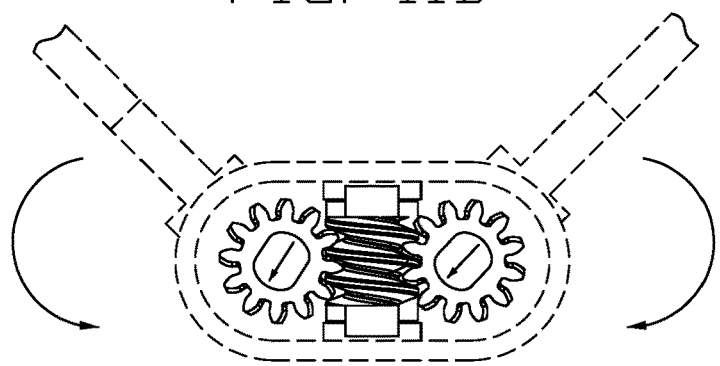
Figure 11D:
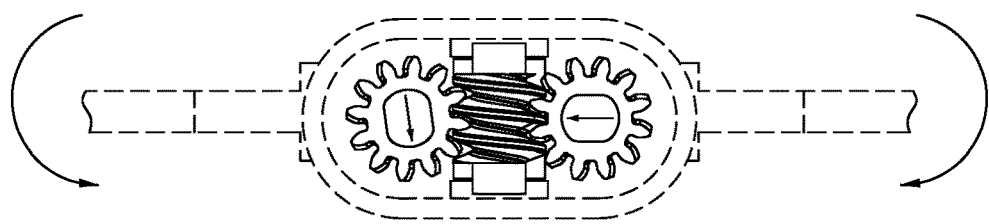
Figure 11E:
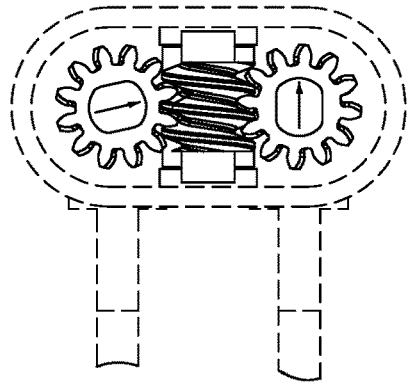
Figure 12A:
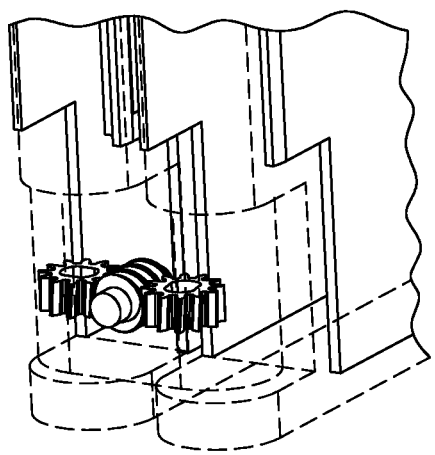
FIG. 12A is an enlarged diagrammatic view of the electronic device of FIG. 11A.
Figure 12B:
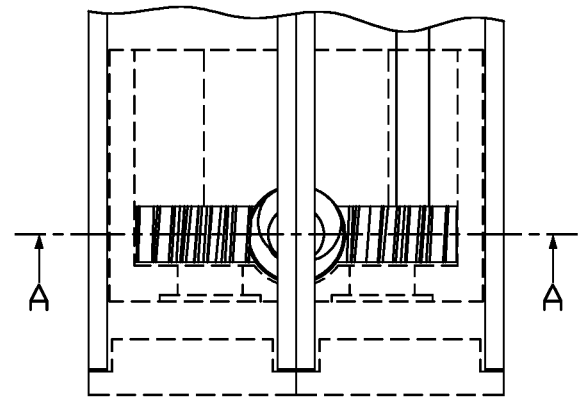
FIG. 12B is an enlarged perspective view of the electronic device of FIG. 11A.
Figure 12C:
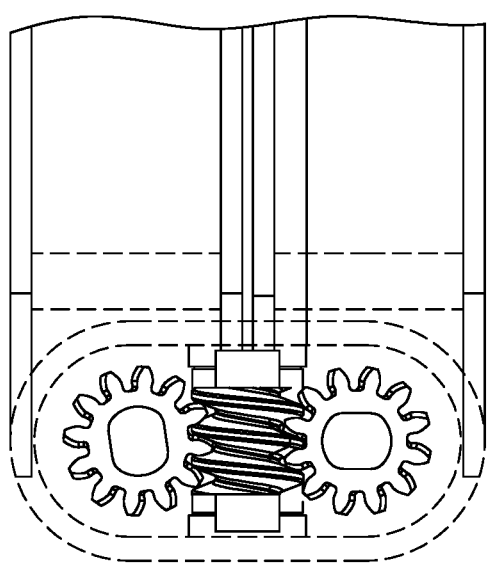
FIG. 12C is a side view along a view line A-A in FIG. 12B.
Figure 12D:
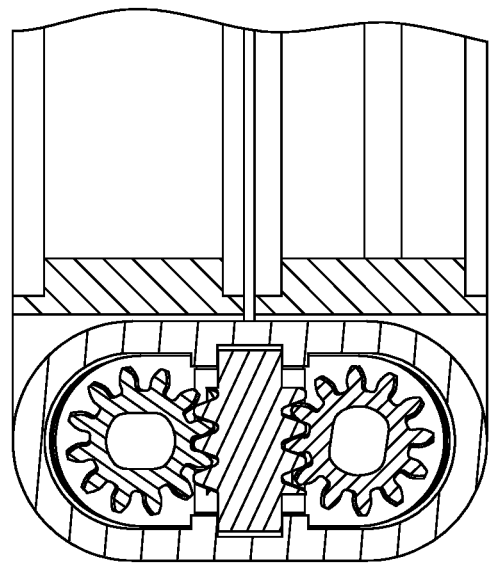
FIG. 12D is a cross-sectional view taken along the view line A-A in FIG. 12B.
Figure 13A:
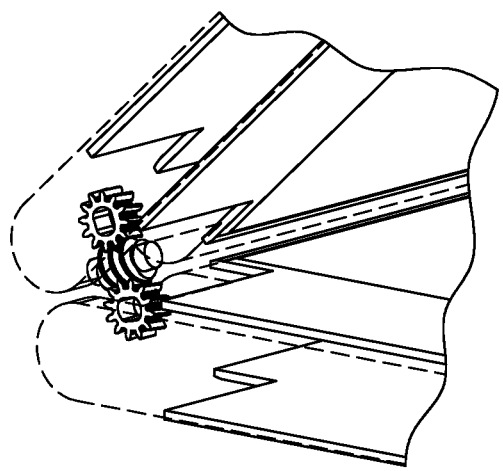
FIG. 13A is an enlarged diagrammatic view of the electronic device of FIG. 11B.
Figure 13B:
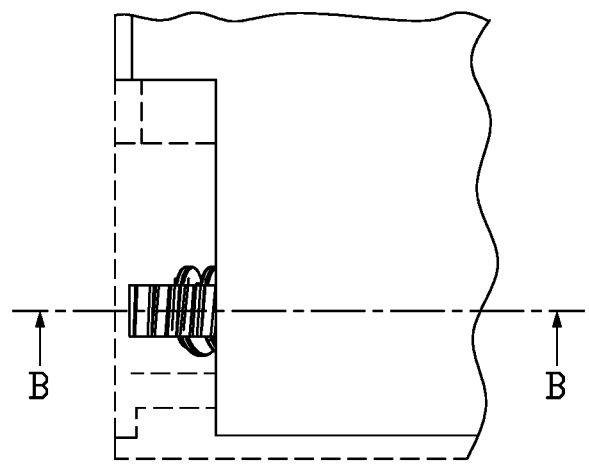
FIG. 13B is an enlarged perspective view of the electronic device of FIG. 11B.
Figure 13C:
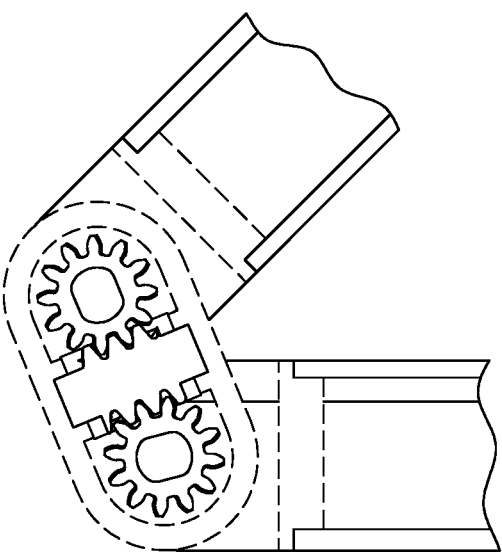
FIG. 13C is a side view along a view line B-B in FIG. 13B.
Figure 13D:
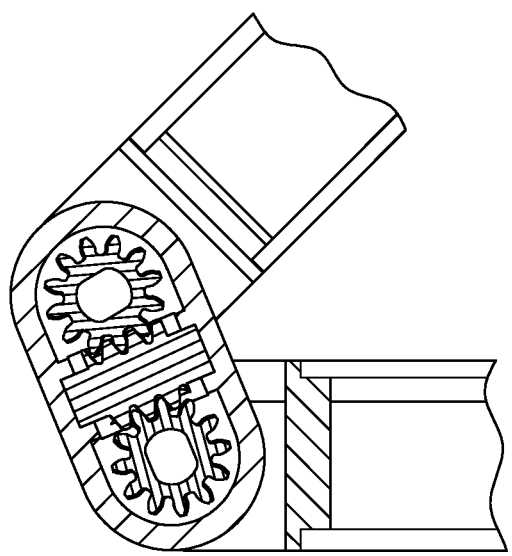
FIG. 13D is a cross-sectional view taken along the view line B-B in FIG. 13B.
Figure 14A:
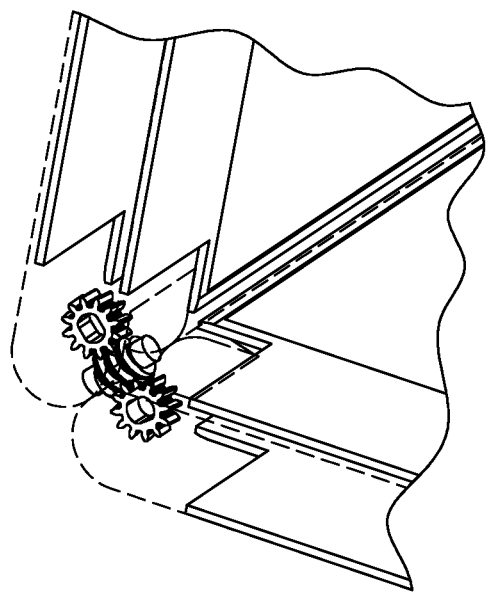
FIG. 14A is an enlarged diagrammatic view of the electronic device of FIG. 11C.
Figure 14B:
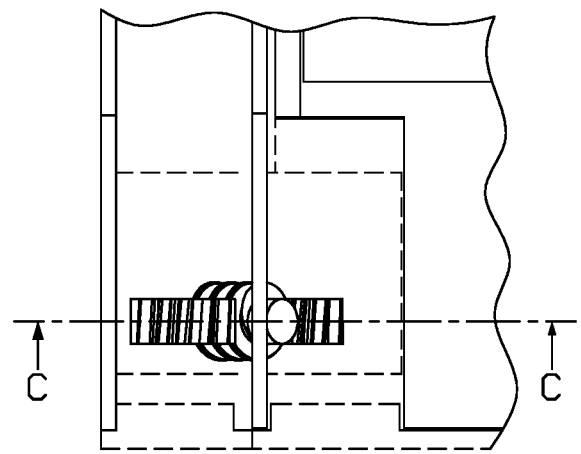
FIG. 14B is an enlarged perspective view of the electronic device of FIG. 11C.
Figure 14C:
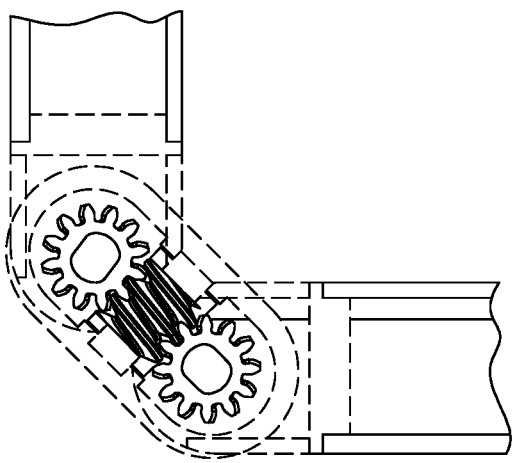
FIG. 14C is a side view along a view line C-C in FIG. 14B.
Figure 14D:
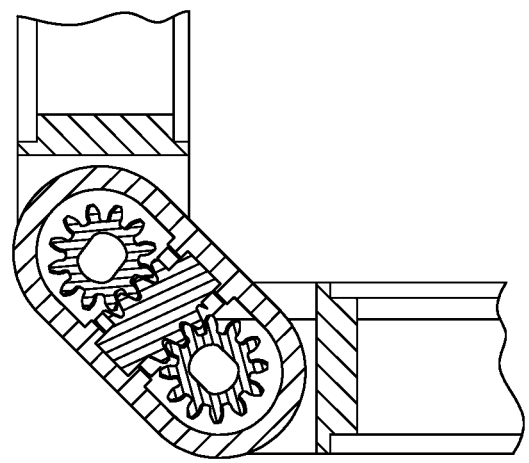
FIG. 14D is a cross-sectional view taken along the view line C-C in FIG. 14B.
Figure 16A:
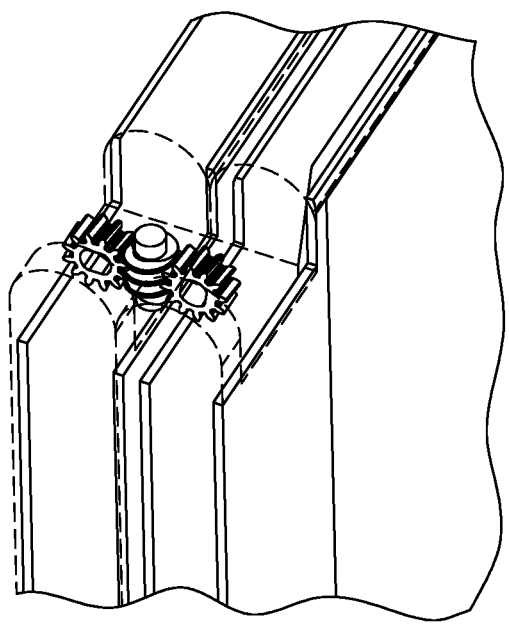
FIG. 16A is an enlarged diagrammatic view of the electronic device of FIG. 11E.
Figure 16B:
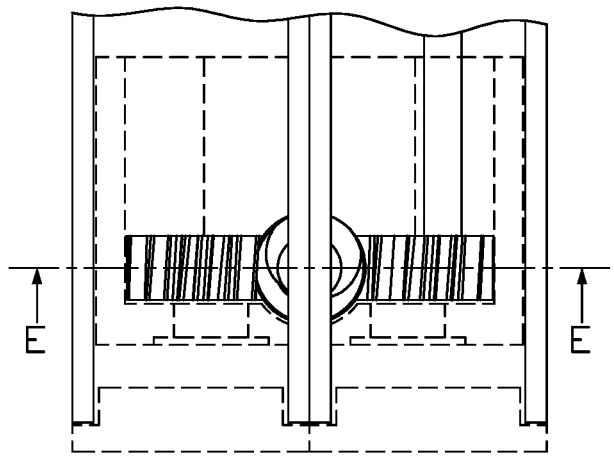
FIG. 16B is an enlarged perspective view of the electronic device of FIG. 11E.
Figure 16C:
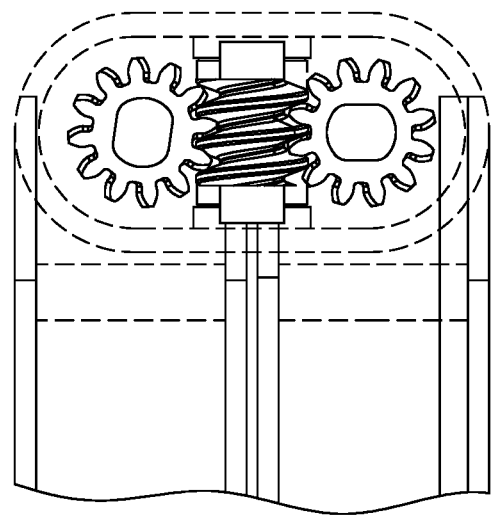
FIG. 16C is a side view along a view line E-E in FIG. 16B.
Figure 16D:
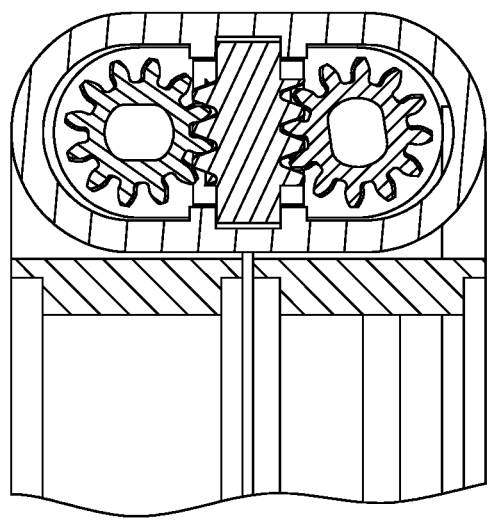
FIG. 16D is a cross-sectional view taken along the view line E-E in FIG. 16B.

Referring to FIG. 9, the first body 201 includes a first display 201a, a first battery 201b, and an upper cover 201c. The second body 202 includes a second display 202a, a second battery 202b, a main logic board (MLB) 202c, and a lower cover 202d.

Referring to FIGS. 10A to 10E, and 11A to 11E, in combination with FIG. 2, the first rotating shaft 21 is connected to the first wheel 11, the second rotating shaft 31 is connected to the second wheel 12. The first wheel 11 and the second wheel 12 are coupled to left and right sides of the worm 13, respectively. When the first rotating shaft 21 rotates clockwise, the first wheel 11 is driven by the first rotating shaft 21 to rotate clockwise, so that the second wheel 12 and the second rotating shaft 31 are driven to rotate counterclockwise. Thus, the first rotating shaft 21 rotating counterclockwise causes the second rotating shaft 31 to rotate clockwise, and vice versa. Through the meshing of the first wheel 11 and the second wheel 12, the first rotating shaft 21 and the second rotating shaft 31 can drive the first body 201 and the second body 202 to open and close synchronously at an equal angle. No matter the relative angle between the first rotating shaft 21 and the second rotating shaft 31, the first wheel 11, the second wheel 12, and the worm 13 are always located on a same plane. The relative positions of the first wheel 11, the second wheel 12, and the worm 13 do not change during the rotation. That is, during the rotation of the first rotating shaft 21 and the second rotating shaft 31 from zero degrees to 360 degrees, the worm 13 does not protrude out from the first wheel 11 or out from the second wheel 12. A flat plane with no protrusions or depressions is formed when the first body 201 and the second body 202 of the electronic device 200 are fully expanded or opened to achieve the best display effect. When the angle between the first body 201 and the second body 202 of the electronic device 200 is zero degrees or 360 degrees, a minimum volume of the electronic device 200 is achieved.

Referring to FIGS. 12A to 12D, 13A to 13D, 14A to 14D, 15A to 15D, and 16A to 16D, the angles between the first body 201 and the second body 202 in the electronic device 200 can be equal to zero degrees, 45 degrees, 90 degrees, 180 degrees, and 360 degrees, respectively. When observed in the electronic device 200 from different directions at each of the angles above, at no time does the connecting structure 100 protrude out from the first body 201 or out from the second body 202, and the worm 13 of the connecting structure 100 does not protrude out from the first wheel 11 and out from the second wheel 12.

The connecting structure 100 in the electronic device 200 allows the first body 201 and the second body 202 to open and close freely from zero degrees through to 360 degrees. The connecting structure 100 is always below or at least not above an outer surface of the first body 201 and an outer surface of the second body 202 during rotation of the first body 201. The connecting structures 100 is provided a certain tension to the first body 201 and the second body 202 during rotation. When the angle between the first body 201 and the second body 202 is equal to 180 degrees, the two are rotated to be coplanar with each other to make the first display 201a and the second display 202a in a single plane to achieve the best display effect.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A connecting structure comprising:
   a hinge assembly comprising a first wheel, a second wheel, and a worm disposed between and engaged with the first wheel and the second wheel, wherein a central axis of the first wheel is parallel to a central axis of the second wheel, a central axis of the worm is perpendicular to each of the central axis of the first wheel and the central axis of the second wheel, a rotation direction of the first wheel is opposite to a rotation direction of the second wheel;
   a first shaft body comprising a first rotating shaft extending through the first wheel and a first connecting plate connected to the first rotating shaft, wherein the first rotating shaft and a sidewall of the first connecting plate facing the first rotating shaft define a first groove, the first wheel is partially received in the first groove;
   a second shaft body comprising a second rotating shaft extending through the second wheel and a second connecting plate connected to the second rotating shaft, wherein the second rotating shaft and a sidewall of the second connecting plate facing the second rotating shaft cooperatively define a second groove, the second wheel is partially received in the second groove; and
   a fixing member configured to fix the hinge assembly.

2. The connecting structure of claim 1, wherein the fixing member comprises a supporting plate and at least one first fixing portion disposed on the supporting plate, each of the first rotating shaft and the second rotating shaft extends through the supporting plate, at least one end of the worm is rotationally fixed on the at least one first fixing portion.

3. The connecting structure of claim 2 wherein the fixing member further comprises a fixing sleeve, the fixing sleeve is configured to sleeve on the hinge assembly.

4. The connecting structure of claim 3, wherein the fixing sleeve comprises a fixing body and at least one second fixing portion disposed on an inner wall of the fixing body, at least one end of the worm is rotatably disposed on the at least one second fixing portion.

5. The connecting structure of claim 1, wherein the fixing member comprises a fixing sleeve, the fixing sleeve comprises a fixing body and at least one second fixing portion disposed on an inner wall of the fixing body, the fixing body is configured to sleeve on the hinge assembly, at least one end of the worm is rotatably disposed on the at least one second fixing portion.

6. The connecting structure of claim 2, further comprising an elastic unit, wherein the elastic unit comprises a first elastic member, a second elastic member, and an elastic supporting plate, the first rotating shaft extends through the first elastic member and then through the elastic supporting plate, the second rotating shaft extends through the second elastic member and then through the elastic supporting plate, the elastic unit is configured to maintain the first shaft body and the second shaft body at a position, during a rotation of the hinge assembly, two void avoidance grooves are defined on a connecting plate of the supporting plate. the first elastic member and the second elastic member are partially received in the two void avoidance grooves, respectively.

7. The connecting structure of claim 1, wherein the first connecting plate is perpendicular to the first rotating shaft, the second connecting plate is perpendicular to the second rotating shaft.

8. The connecting structure of claim 1, wherein the fixing member further comprises two rotating shaft fixing portions, the first rotating shaft extends through the first wheel, and the second rotating shaft extends through the second wheel, the first rotating shaft and the second rotating shaft are rotatably fixed on the two rotating shaft fixing portions, respectively.

9. An electronic device comprising:
   at least one connecting structure each comprising:
      a hinge assembly comprising a first wheel, a second wheel, and a worm disposed between and engaged with the first wheel and the second wheel, wherein a central axis of the first wheel is parallel to a central axis of the second wheel, a central axis of the worm is perpendicular to each of the central axis of the first wheel and the central axis of the second wheel, a rotation direction of the first wheel is opposite to a rotation direction of the second wheel;
      a first shaft body comprising a first rotating shaft extending through the first wheel and a first connecting plate connected to the first rotating shaft, wherein the first rotating shaft and a sidewall of the first connecting plate facing the first rotating shaft define a first groove, the first wheel is partially received in the first groove;
      a second shaft body comprising a second rotating shaft extending through the second wheel and a second connecting plate connected to the second rotating shaft, wherein the second rotating shaft and a sidewall of the second connecting plate facing the second rotating shaft define a second groove, the second wheel is partially received in the second groove; and
      a fixing member configured to fix the hinge assembly;
   a first body connected to the first shaft body; and
   a second body connected to the second shaft body,
      wherein the first body and the second body are rotatably connected to each other through the at least one connecting structure.

10. The electronic device of claim 9, wherein the first body is configured to rotate to an angle relative to the second body, the angle is in a range of zero to 360 degrees, the at least one connecting structure is flush or lower than an outer surface of the first body and an outer surface of the second body when the first body is being rotated.

11. The electronic device of claim 10, wherein the at least one connecting structure is coplanar with the first body and the second body when the angle is 180 degrees between the first body and the second body.

12. The electronic device of claim 9, wherein the fixing member comprises a supporting plate and at least one first fixing portion disposed on the supporting plate, the first rotating shaft and the second rotating shaft extend through the supporting plate, at least one end of the worm is rotationally fixed on the at least one first fixing portion.

13. The electronic device of claim 12, wherein the fixing member further comprises a fixing sleeve, the fixing sleeve is configured to sleeve on the hinge assembly.

14. The electronic device of claim 13, wherein the fixing sleeve comprises a fixing body and at least one second fixing portion disposed on an inner wall of the fixing body, at least one end of the worm is rotatably disposed on the at least one second fixing portion.

15. The electronic device of claim 9, wherein the fixing member comprises a fixing sleeve, the fixing sleeve comprises a fixing body and at least one second fixing portion disposed on an inner wall of the fixing body, the fixing body is configured to sleeve on the hinge assembly, at least one end of the worm is rotatably disposed on the at least one second fixing portion.

16. The electronic device of claim 12, wherein each of the at least one connecting structure further comprises an elastic unit, the elastic unit comprises a first elastic member, a second elastic member, and an elastic supporting plate, the first rotating shaft extends through the first elastic member and then through the elastic supporting plate, the second rotating shaft extends through the second elastic member and then through the elastic supporting plate, the elastic unit is configured to maintain the first shaft body and the second shaft body at a position, during a rotation of the hinge assembly, two void avoidance grooves are defined on a connecting plate of the supporting plate, the first elastic member and the second elastic member are partially received in the two void avoidance grooves, respectively.

17. The electronic device of claim 9, wherein the first connecting plate is perpendicular to the first rotating shaft, the second connecting plate is perpendicular to the second rotating shaft.

18. The electronic device of claim 9, wherein the fixing member further comprises two rotating shaft fixing portions, the first rotating shaft extends through the first wheel, and the second rotating shaft extends through the second wheel, the first rotating shaft and the second rotating shaft are rotatably fixed on the two rotating shaft fixing portions, respectively.

* * * * *